(12) United States Patent
Van Bommel et al.

(10) Patent No.: US 10,875,005 B2
(45) Date of Patent: Dec. 29, 2020

(54) COATED LUMINESCENT PARTICLE, A LUMINESCENT CONVERTER ELEMENT, A LIGHT SOURCE, A LUMINAIRE AND A METHOD OF MANUFACTURING A COATED LUMINESCENT PARTICLE

(71) Applicant: LUMILEDS LLC, San Jose, CA (US)

(72) Inventors: Ties Van Bommel, Eindhoven (NL); Peter Josef Schmidt, Eindhoven (NL); Martinus Petrus Joseph Peeters, Eindhoven (NL); Rene Theodorus Wegh, Eindhoven (NL); Gerardus Wilhelmus Gerbe Van Dreumel, Eindhoven (NL); Rene Jan Hendriks, Eindhoven (NL); Christoph Gerard August Hoelen, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 625 days.

(21) Appl. No.: 14/763,861

(22) PCT Filed: Feb. 25, 2014

(86) PCT No.: PCT/IB2014/059228
§ 371 (c)(1),
(2) Date: Jul. 28, 2015

(87) PCT Pub. No.: WO2014/128676
PCT Pub. Date: Aug. 28, 2014

(65) Prior Publication Data
US 2015/0362150 A1    Dec. 17, 2015

Related U.S. Application Data

(60) Provisional application No. 61/768,613, filed on Feb. 25, 2013.

(51) Int. Cl.
*C23C 16/40* (2006.01)
*C09K 11/02* (2006.01)
(Continued)

(52) U.S. Cl.
CPC ............. *B01J 13/22* (2013.01); *C09K 11/025* (2013.01); *C09K 11/08* (2013.01); *C23C 16/403* (2013.01); *C23C 16/45555* (2013.01)

(58) Field of Classification Search
CPC .......... F21V 9/16; B01J 13/22; C09K 11/025; C23C 16/403; C23C 16/45555
See application file for complete search history.

(56) References Cited

U.S. PATENT DOCUMENTS

| 4,276,363 A | 6/1981 | Manabe et al. |
| 5,792,509 A | 8/1998 | Lin et al. |

(Continued)

FOREIGN PATENT DOCUMENTS

| CN | 101508561 A | 8/2009 |
| EP | 0432500 A2 | 11/1990 |

(Continued)

OTHER PUBLICATIONS

Wenbo Bu and Jianlin Shi, Characterization of Highly Luminescent LaPO4:Eu3+/LaPO4 One-Dimensional Core/Shell Heterostructures, J. Nanosci. Nanotechnol., vol. 8, No. 3, 1266-1271, 2008.Copyright © 2008 American Scientific Publishers.*

(Continued)

*Primary Examiner* — Bijan Ahvazi

(57) ABSTRACT

A coated luminescent particle 100, a luminescent converter element, a light source, a luminaire and a method of manufacturing coating luminescent particles are provided. The coated luminescent particle 100 comprises a luminescent particle 102, a first coating layer 104 and a second coating layer 106. The luminescent particle 102 comprises lumines- (Continued)

cent material for absorbing light in a first spectral range and for converting the absorbed light towards light of a second spectral range. The luminescent material is sensitive for water. The first coating layer 104 forms a first barrier for water and comprises a metal oxide or a nitride, phosphide, sulfide based coating. The second coating layer 106 forms a second barrier for water and comprises a silicon based polymer or comprises a continuous layer of one of the materials $AlPO_4$, $SiO_2$, $Al_2O_3$, and $LaPO_4$. The first coating layer 104 and the second coating layer 106 are light transmitting. The first coating layer 104 encapsulates the luminescent particle and the second coating layer 106 encapsulates the luminescent particle 102 with the first coating layer 104.

14 Claims, 5 Drawing Sheets

(51) Int. Cl.
*C23C 16/455* (2006.01)
*B01J 13/22* (2006.01)
*C09K 11/08* (2006.01)

(56) References Cited

U.S. PATENT DOCUMENTS

| | | |
|---|---|---|
| 7,867,556 B2 | 1/2011 | Pickett |
| 2002/0105266 A1 | 8/2002 | Juestel et al. |
| 2002/0150760 A1 | 10/2002 | Klinedinst |
| 2007/0125984 A1* | 6/2007 | Tian ............... C09K 11/025 252/301.4 S |
| 2008/0185600 A1 | 8/2008 | Thomas |
| 2010/0283076 A1 | 11/2010 | Winkler et al. |
| 2011/0068322 A1 | 3/2011 | Pickett et al. |
| 2012/0037850 A1 | 2/2012 | Lee et al. |
| 2013/0256715 A1 | 10/2013 | Itoh et al. |

FOREIGN PATENT DOCUMENTS

| | | | |
|---|---|---|---|
| EP | 1717289 A1 | 11/2006 | |
| GB | 2034910 A | 6/1980 | |
| JP | 2000096045 A | 4/2000 | |
| JP | 2003223008 A | 8/2003 | |
| JP | 2007116139 A | 5/2007 | |
| JP | 2009009711 A | 1/2009 | |
| JP | 2009514993 A | 4/2009 | |
| JP | 2009249507 A | 10/2009 | |
| JP | 2011231266 * | 11/2011 | ............. C09K 11/08 |
| JP | 2011231266 A | 11/2011 | |
| JP | 2012201707 * | 10/2012 | ............. C09K 11/08 |
| JP | 2012201707 A | 10/2012 | |
| JP | 2013505347 A | 2/2013 | |
| RU | 2344162 C2 | 4/2004 | |
| RU | 2346022 C2 | 6/2006 | |
| WO | 0022065 | 4/2000 | |
| WO | 2004096714 A1 | 11/2004 | |
| WO | 2004096943 A1 | 11/2004 | |
| WO | 2012077656 A1 | 5/2014 | |

OTHER PUBLICATIONS

Cho et al, "Control of AlPO4 Nanoparticle Coating on LiCoO2 by Using Water or Ethanol" Electrochimica Acta 50 (2005) p. 4182-4187.
Decision on Rejection dated Aug. 23, 2017, China Patent Application No. 201480010358.0, 15 pages.
Office Action dated Oct. 3, 2017, Japan Application No. 2015-558595, 8 pages.
EPO as ISA, PCT/IB2014/059228 filed Feb. 25, 2014, "International Search Report and Written Opinion" dated Jun. 2, 2014, 8 pages.
Final Rejection dated Jan. 9, 2018, Japan Application No. 2015-558595, 6 pages.
Official Action dated Feb. 5, 2018, Russian Application No. 2015140756, 15 pages.
First Office Action dated Sep. 20, 2016, China Patent Application No. 201480010353.0, 17 pages.
Second Office Action dated Dec. 26, 2016, China Patent Application No. 201480010358.0, 15 pages.
Third Office Action dated May 11, 2017, China Patent. Application No. 201480010358.0, 13 pages.
Bu, et al, "Characterization of Highly Luminescent LaPO4:Eu3+/LaPO4 One-Dimensional Core/Shell Heterostructures", Journal of Nanoscierice and Nariotechnology, 2008, vol. 8, pp. 1266-1271.
Kulshreshtha, et al., "Probing the interface of core shell particles of GaPO4 and A1PO4 by 31P MAS NMR spectroscopy", Solid State Sciences 13, 2011, pp. 484-487.
JPO Office Action dated Jun. 27, 2017, Japan Patent Application No. 2015-558595, 9 pages.
Official Action dated May 17, 2018, Russian Application No. 2015140756, 10 pages.
Decision of Refusal dated Jan. 9, 2019, Japan Application No. 2015-558595, 6 pages.
IN Examination Report dated Nov. 1, 2018, India Patent Application No. 4578/CHENP/2015, 5 pages.
Reexamination Decision dated Sep. 28, 2018, China Patent Application No. 201480010358.0, 40 page.
Notice of Reexamination dated Jul. 2, 2018, China Patent Application No. 201480010358.0, 20 pages.

* cited by examiner

COATED LUMINESCENT PARTICLE, A LUMINESCENT CONVERTER ELEMENT, A LIGHT SOURCE, A LUMINAIRE AND A METHOD OF MANUFACTURING A COATED LUMINESCENT PARTICLE

CROSS-REFERENCE TO PRIOR APPLICATIONS

This application is the U.S. National Phase application under 35 U.S.C. § 371 of International Application No. PCT/IB2014/059228, filed on Feb. 25, 2014, which claims the benefit of U.S. Patent Application No. 61/768,613, filed on Feb. 25, 2013. These applications are hereby incorporated by reference herein.

FIELD OF THE INVENTION

The invention relates to luminescent particles which are coated.

The invention further relates to a method of manufacturing coated luminescent particles.

BACKGROUND OF THE INVENTION

Particular luminescent materials are sensitive for water, which means that the luminescent material reacts with water such that other materials are formed. This may dramatically decrease the performance of a light conversion element which comprises the luminescent material, it may also result in the creation of hazardous and/or toxic fluids or solid materials.

Particular luminescent materials are often used as narrow band light emitters to obtain high quality white light with a relatively high conversion efficiency. Sulfide based phosphors such as calcium sulfide (CaS), strontium sulfide (SrS), calcium selenide sulfide (CaSeS) doped by europium (Eu) are potential candidates to be used for this purpose. However, these sulfide-based phosphors are particularly sensitive to water and may react to form calcium or strontium hydroxide and sulfide gas. In addition to the decrease in phosphor performance, the release of $H_2S$ is also a problem because it is a toxic, flammable and foul-smelling gas. Furthermore, phosphors based on Ca(Se,S) may upon reaction with water also release small amounts of $H_2Se$ gas, which is highly toxic. It is therefore needed to protect the phosphor with a coating.

SUMMARY OF THE INVENTION

It is an object of the invention to provide coated luminescent particles comprising a water sensitive luminescent material which are well-protected against the influences of water and which may be manufactured in a relatively efficient way.

A first aspect of the invention provides a coated luminescent particle. A second aspect of the invention provides a luminescent converter element. A third aspect of the invention provides a light source. A fourth aspect of the invention provides a luminaire. A fifth aspect of the invention provides a method of manufacturing coated luminescent particles. Advantageous embodiments are defined in the dependent claims.

A coated luminescent particle in accordance with the first aspect of the invention comprises a luminescent particle, a first coating layer and a second coating layer. The luminescent particle comprises luminescent material which is configured to absorb light in a first spectral range and to convert a portion of the absorbed light towards light of a second spectral range. The luminescent material may be sensitive for water. The first coating layer forms a first barrier for water (around the luminescent particle) and comprises a metal oxide or a nitride, phosphide, sulfide based coating. The second coating layer forms a second barrier for water (around the luminescent particle with the first coating layer) and comprises a silicon based polymer or comprises a continuous layer of one of the materials from the group of $AlPO_4$, $SiO_2$, $Al_2O_3$, and $LaPO_4$. The first coating layer and the second coating layer are light transmitting. The first coating layer encapsulates the luminescent particle and the second coating layer encapsulates the luminescent particle with the first coating layer.

In other words, the luminescent particle is coated with a hybrid coating which comprises at least two layers which both form a barrier for water. In particular, the combination of the two layers provide a good barrier for water and the luminescent material does not deteriorate because of chemical reactions with water and also, during use, the barrier remains its properties because the second coating is relatively scratch resistant.

Because of the water sensitivity of the luminescent particles, it seems to be logical to use coating technologies which do not expose the luminescent material to water or which expose the luminescent material to a very limited degree to water in the coating process. In the field of coating technologies layer deposition techniques (such as atomic layer deposition, chemical vapor deposition or physical vapor deposition) have been suggested to create a water resistant layer of a metal oxide around a water sensitive particle. However, these thin layers of metal oxides (or a coating based on a nitride, phosphide or sulfide) usually have poor scratch resistance such that the luminescent particle coating might be damaged e.g. during production of the phosphor elements or during use. Thus, in order to manufacture a relatively reliable water barrier with such a technology, the layer of metaloxide (or a coating based on a nitride, phosphide or sulfide) must be relatively thick, which leads to relatively high costs.

The inventors have realized that, although the luminescent material is water sensitive, the useable coating technologies are not limited to layer deposition techniques. With a hybrid coating, which comprises two different layers and which may be provided with two different coating technologies, a water barrier of a high quality may be manufactured around a luminescent particle while the manufacturing costs are kept within acceptable limits and specific disadvantages of a single metal oxide layer are overcome. The coated luminescent particles comprise the first thin coating layer of a metal oxide which protects the luminescent material enough for water such that the second coating layer may be manufactured with a coating technique in which water or other liquids is involved. Such coating techniques in which water is involved are, in general, much cheaper and they provide possibilities to manufacture a mechanically stable coating layer at the outside of the coated luminescent particle. Especially such a mechanically stable coating layer is scratch resistance. The second coating layer according to the invention is manufactured with, for example, a sol-gel technology.

The luminescent material may be sensitive for water. In the context of this document it means that the luminescent material reacts with water such that the luminescent material gets inferior (luminescent) characteristics and/or deteriorates. In general, when the luminescent material reacts with water, new materials are formed and in specific situations such materials may be hazardous or toxic.

The term encapsulate is used in the context of the first coating layer and the second coating layer. When the first coating layer encapsulates the luminescent particles, it means in the context of the invention that the luminescent particle is surrounded by the first coating layer, or, the first coating layer encloses the luminescent particle. However, it is not necessary that the first coating layer is in direct contact with the luminescent material. Other layers may be provided in between the luminescent particle and the first coating layer. The second coating layer encapsulates the luminescent particles that are provided with the first coating layer. Thus, as well as the luminescent particle and the first coating layer are surrounded by or the second coating layer—in other words, the second coating layer encloses the first coating layer and the luminescent particle. However, it is not necessary that the second coating layer is directly applied on top of the first coating layer and other layers may be in between the first coating layer and the second coating layer.

The first coating layer and the second coating layer form a barrier for water which means that substantially no water can penetrate through the coating layers. In practical embodiments, it means that it is relatively difficult for water to get through the first coating layer and/or the second coating layer. At least the combination of first coating layer and the second coating layer cannot be penetrated by water. It is to be noted that this relates to the first coating layer and the second coating layer when being in a good condition, which means, when not being damaged. When the respective layers are locally damaged, it is not excluded that the respective layer allows some water to penetrate locally through the respective layers.

The first coating layer and the second coating layer are light transmitting which means that at least a portion of the light, which impinges on the respective layers, is transmitted through the respective layer. Thus, the first layer and the second layer may be fully or partially transparent, or may be translucent. In an embodiment, more than 90% of the light which impinges on the coating layers is transmitted through the coating layers. The first coating layer and/or the second coating layer may be light transmitting because of characteristics of the materials of which the coating layers are made. For example, the coating layer may be made from a material which is transparent, even if the layer is relatively thick. In another embodiment, the first coating layer and/or the second coating layer is thin enough such that the respective layer becomes light transmitting while the material of which the layer is manufactured is not transparent or translucent when manufactured in relatively thick layers.

Examples of metal oxides used in the first coating layer are ZnO, $TiO_2$, $Al_2O_3$ or $ZrO_2$. Examples of transparent nitrides, phosphides and sulfides used in the first coating layer are TiN, $Si_3N_4$, $Hf_3N_4$, $Zr_3N_4$, InP, GaP or ZnS.

Optionally, the luminescent material comprises sulfide (S) or comprises selenide (Se). There are luminescent materials available which have a light emission spectrum in the green or orange/red spectral range which comprises sulfide and selenide. These materials are often sensitive for water and especially when, during chemical reactions, gasses are formed which comprises sulfide or selenide, toxic and/or hazardous gasses may be formed such as $H_2S$ or $H_2Se$ gas. The use of the hybrid coating according to invention prevents that these reactions can occur. The luminescent material may also be selected from the groups of orthosilicates or thiogallates. These materials may also react with water which, at least, resulting in a deteriorated luminescent material.

Optionally, the luminescent material comprises at least one of the materials calcium sulfide (CaS), strontium sulfide (SrS), calcium selenide sulfide (CaSeS). These materials are often doped with europium (Eu) to obtain their luminescent character. The materials of this optional embodiment have a light emission spectrum the in the red spectral range and have a light emission spectrum which is relatively narrow (Full Width Half Maximum value of light emission spectrum smaller than 100 nanometer, and optionally, smaller than 60 nanometer). These materials are advantageous to use obtain high quality white light with a relatively high conversion efficiency.

Optionally, a diameter of the luminescent particle is smaller than 200 micrometer. If the luminescent particle is small enough, it has a relatively large surface area and, thus, a relatively large area on which light may impinge and, thus, a relatively large amount of light may be absorbed for conversion towards light of the second spectral range. The diameter of the particle is defined as the maximum of all intersectional distances of the all possible imaginary lines that intersect with the particle. In other specific embodiments, it might be advantageous to have a luminescent particle that is large enough such that the light of the first spectral range (which is the light that is absorbed by the luminescent particle) is not able to partially transmit through the luminescent particle, which means that, in use, less light of the first spectral rang is transmitted through a layer which comprises the coated luminescent particles.

Optionally, a thickness of the first coating layer is within the range from 5 to 30 nanometer, and, in another optional embodiment, the thickness of the first coating layers is within the range from 10 to 20 nanometer. If the first coating layer has such a thickness it forms an effective barrier for water and a relatively small amount of material and/or processing time is required to manufacture the layer. The thickness is measured along a line that is oriented perpendicular to the first coating layer.

Optionally, a thickness of the second coating layer is within the range from 30 to 80 nanometer, and, in another optional embodiment, the thickness of the second coating layer is within the range from 40 to 60 nanometer. If the second coating layer has such a thickness it forms an effective barrier for water and a relatively small amount of material and/or processing time is required to manufacture the layer. The thickness is measured along a line that is oriented perpendicular to the second coating layer.

Optionally, the coated luminescent particle further comprises a third coating layer being interposed between the first coating layer and the second coating layer. The third coating layer is one of a metal oxide layer, a layer of a silicone based polymer, or a continuous layer of one of the materials form the group of $AlPO_4$, $SiO_2$, $Al_2O_3$, and LaPO4. The third coating layer is light transmitting and forms a barrier for water. Thus, in other words, the hybrid coating around the luminescent particles comprises an additional coating layer which has characteristics that are similar to the first coating layer and/or the second coating layer. The invention is not limited to hybrid coatings with two or three layer also more than three layers may be used. Furthermore, the third coating layer is in between the first coating layer and the second coating layer, but is not necessarily in direct contact with the first coating layer and/or the second coating layer. More layers may be in between the first coating layer and the second coating layer, and, thus, in between the first coating layer and the third coating layer and/or in between the second coating layer and the third coating layer. The coated luminescent particles of this optional embodiment are better protected against water by means of the three coating layers.

Optionally, the Silicon based polymer is obtained from a material from a group of compounds that is formed by

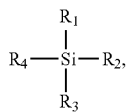

wherein a) R1, R2 and R3 are hydrolysable alkoxy groups and R4 is selected from the group of C1-C6 linear alkyl groups, hydrolysable alkoxy groups and a phenyl group, or b) R1, R2 and R3 are individually selected from —OCH$_3$ and —OC$_2$H$_5$ and R4 is selected from —CH$_3$, —C$_2$H$_5$, —OCH$_3$, —OC$_2$H$_5$ and a phenyl group. When the Silicon based polymer is obtained from these materials, a good water barrier may be manufactured as a relatively thin layer around the luminescent particle which comprises already the first coating layer.

Optionally, the second coating layer is manufactured by a sol-gel based technology, which is a relatively efficient and effective solution or manufacturing a coating layer based on the above discussed materials.

Optionally, the silicone based polymer is obtained from a material from the group of:

Tetramethoxysilane:

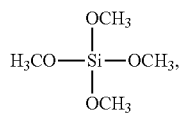

Tetraethoxysilane:

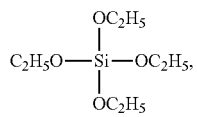

trimethoxy(methyl)silane:

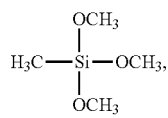

and
triethoxy(methyl)silane:

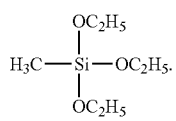

The materials of this optional embodiment are advantageous materials to manufacture a good water barrier in a relatively thin layer around a particle with a sol-gel based technology.

According to a second aspect of the invention, a luminescent converter is provided which comprises coated luminescent particles according to the first aspect of the invention and comprises a binder for binding the coated luminescent particles in the luminescent converter element. The binder is, for example, matrix polymer such as, for example, polymethyl methacrylate (PMMA), polyethylene terephthalate (PET), polyethylene naphthalate (PEN), polycarbonate (PC), a silicone material or a glass material.

The luminescent converter according to the second aspect of the invention provides the same benefits as the coated luminescent particle according to the first aspect of the invention and has similar embodiments with similar effects as the corresponding embodiments of the coated luminescent particle.

According to a third aspect of the invention, a light source is provided which comprises a light emitter for emitting a light emission. The light emission at least comprises light in the first spectral range. The light source further comprises a luminescent converter element according to the second aspect of the invention. The luminescent converter element is arranged in the light source such that it receives, light emitted by the light emitter. The luminescent converter element may be provided directly on top of a light emitting surface of the light emitter (when the light emitter is in operation). In other embodiments a gap filled with a light transmitting material may be presented in between a surface of the light emitter, which emits the light in operation, and the luminescent converter element. The gap may have a thickness of one or two millimeters and the gap may have a thickness in the order of one or more centimeters. The first configuration is termed the vicinity configuration in which the luminescent converter element is in the vicinity of the light emitting element, and the second configuration is termed the remote configuration. The thickness of the gap is measured along the shortest line from the light emitting surface of the light emitter towards the luminescent converter element. It is further noted that the light rays emitted by the light emitter may also follow a non-straight optical path towards the luminescent converter element and the optical path may be bended by, for example, light guides, lenses, etc., and the light rays may be reflected by, for example, mirrors, etc.

The light source according to the third aspect of the invention provides the same benefits as the luminescent converter element according to the second aspect of the invention or as the coated luminescent particle according to the first aspect of the invention and has similar embodiments with similar effects as the corresponding embodiments of the particle or the element.

According to a fourth aspect of the invention, a luminaire is provided which comprises coated luminescent particles according to the first aspect of the invention, or a luminescent converter according to the second aspect of the invention or a light source according to the third aspect of the invention. The luminaire according to the fourth aspect of the invention provides the same benefits as the light source, the luminescent converter element, and the coated luminescent particle according to the other aspect of the invention and has similar embodiments with similar effects as the corresponding embodiments of the particle, the element or the light source.

According to a fifth aspect of the invention, a method of manufacturing coated luminescent particles is provided. The method comprises the stages of: i) providing luminescent particles of a luminescent material, the luminescent particles are configured to absorb light in a first spectral range and to convert a portion of the absorbed light towards light of a second spectral range, the luminescent material is water sensitive, b) depositing a first coating layer of a metal oxide around the luminescent particles, c) manufacturing a second coating layer around the luminescent particles with the first coating layer by means of a sol-gel technology or with a nanoparticle suspension technology. The basis of the sol-gel comprises a silicic acid ester (which is a material with a central Silicon atom). The nanoparticles suspension technology uses a suspension of $AlPO_4$, $SiO_2$, $Al_2O_3$, and $LaPO_4$ in a liquid.

In particular, by manufacturing the second coating layer around the luminescent particles which comprises the first coating layer, a better water resistant luminescent particles is provide which is scratch resistant and which is manufactured at relatively low manufacturing costs.

The method according to the fifth aspect of the invention provides the same benefits as the coated luminescent particle according to the first aspect of the invention and has similar embodiments with similar effects as the corresponding embodiments of the particle.

Optionally, the stage of depositing a first coating layer of a metal oxide around the luminescent particles may be executed by means of a chemical vapor deposition, a physical vapor deposition or an atomic layer deposition technology.

Optionally, the stage of manufacturing a second coating layer comprises the stage of obtaining a solution of a first material in water. The first material is one of a group of compounds formed by

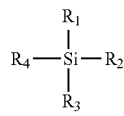

wherein a) R1, R2 and R3 are hydrolysable alkoxy groups and R4 is selected from the group of C1-C6 linear alkyl groups, hydrolysable alkoxy groups and a phenyl group, or b) R1, R2 and R3 are individually selected from $—OCH_3$ and $—OC_2H_5$ and R4 is selected from $—CH_3$, $—C_2H_5$, $—OCH_3$, $—OC_2H_5$ and a phenyl group.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the coated luminescent particles, the luminescent conversion element, the light source, the luminaire and/or the manufacturing method, which correspond to the described modifications and variations of the luminescent coated particle, can be carried out by a person skilled in the art on the basis of the present description.

Figure 1:
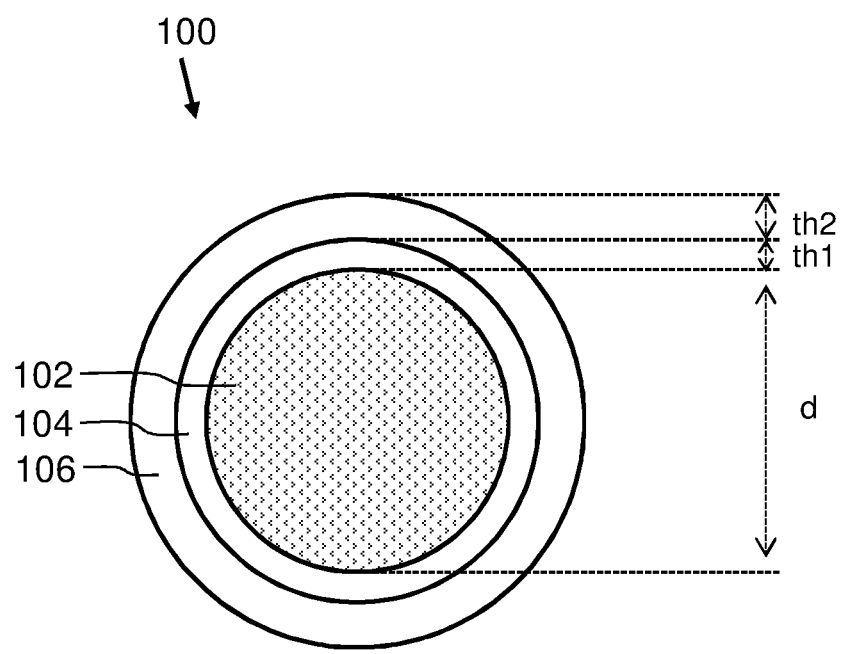
FIG. 1 schematically shows an embodiment of a coated luminescent particle,
FIG. 2 schematically shows another embodiment of a coated luminescent particle,
FIG. 3*a* schematically shows an embodiment of a luminescent element,
FIG. 3*b* schematically shows three embodiments of light sources,
FIG. 4*a* schematically shows another embodiment of a light source,
FIG. 4*b* schematically shows an embodiment of a luminaire, and
FIG. 5 schematically shows an embodiment of a method of manufacturing coated luminescent particles.

It should be noted that items denoted by the same reference numerals in different Figures have the same structural features and the same functions. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

A first embodiment is shown in FIG. 1. FIG. 1 schematically shows an embodiment of a coated luminescent particle 100. The coated luminescent particle 100 comprises a luminescent particle 102 which is enclosed by a first coating layer 104 and the combination of the luminescent particle 102 and the first coating layer 104 is enclosed by a second coating layer 106.

The luminescent particle 102 comprises luminescent material. The luminescent material is configured to absorb light in a first spectral range and converts a portion of the absorbed light towards light of a second spectral range. In particular, in the context of this invention, the luminescent material is sensitive for water which means that the luminescent material reacts with water such that other compounds are formed and the luminescent material deteriorates and/or disappears.

The luminescent particles has, for example, a light emission spectrum in the green or in the red spectral range and has a light absorption spectrum of which the mean wavelength is lower than the mean wavelength of the light emission spectrum. In an embodiment, the Full Width Half Maximum (FWHM) value of the light emission spectrum is smaller than 100 nanometers. In another embodiment, the FWHM value of the light emission spectrum is smaller than 60 nanometer. In an embodiment, the luminescent material comprises sulfide and/or selenide, and/or the luminescent material may comprises at least one of the materials calciumsulfide, strontiumsulfide, calciumselenide sulfide, or a luminescent material of the groups of orthosilicates or thiogallates. In particular the materials calciumsulfide, strontiumsulfide, calciumselenidesulfide have a light emission spectrum in the orange/red spectral range.

As shown in FIG. 1, the luminescent particle 102 has a particular diameter d. In an embodiment, the diameter d of the luminescent particle is smaller than 200 micrometer. In another embodiment, the diameter d of the luminescent particle is smaller than 100 micrometer.

The first coating layer 104 is of a metal oxide and the first coating layer 104 is water resistant and forms a barrier for water. The first coating layer 104 may also be a coating based on a nitride, phosphide or sulfide. The material of the first coating layer 104 is, for example, $Al_2O_3$, $ZrO_2$, ZnO, or $TiO_2$. The first coating layer 104 is at least light transmitting which means that, when light impinges on the first coating layer 104 at least a portion of the light is transmitted through the first coating layer 104. As indicated FIG. 1, the first coating layer 104 has a particular thickness th1. In an embodiment, the thickness th1 of the first coating layer 104 is within a range from 5 nanometer to 30 nanometer. In another embodiment, the thickness th1 of the first coating layer 104 is within a range from 10 nanometer to 20 nanometer. In an embodiment, the first coating layer 104 is manufactured by means of a layer deposition technology, such as, for example, atomic layer deposition, chemical vapor deposition or physical vapor deposition.

The second coating layer 106 comprises a Silicon based polymer or the second layer comprises a continuous layer of one of the material from the group of $AlPO_4$, $SiO_2$, $Al_2O_3$, and $LaPO_4$. The second coating layer 106 is light transmitting and forms a barrier for water such, when the second coating layer 106 is not damaged and fully covers the luminescent particle (with first coating layer 104), no water is able to penetrate through the second coating layer 106 towards the first coating layer 104.

As indicated FIG. 1, the second coating layer 106 has a particular thickness th2. In an embodiment, the thickness th2 of the second coating layer 106 is within a range from 30 nanometer to 80 nanometer. In another embodiment, the thickness th2 of the first coating layer 104 is within a range from 40 nanometer to 60 nanometer.

In an embodiment, when the second coating layer 106 comprises one of the material from the group of $AlPO_4$, $SiO_2$, $Al_2O_3$, and $LaPO_4$, the second coating layer 106 is a continuous layer of one of these materials and is obtained from nanoparticles of one of these materials. Forming such a layer from nanoparticle is often performed by forming a suspension of these nanoparticles and mixing the luminescent particle 102 with the first coating layer 104 in such a suspension. Subsequently the mixture is dried and subsequently annealed. In an article "Control of $AlPO_4$-nanoparticle coating on $LiCoO_2$ by using water or ethanol" of J. Cho et. al, Electrochimica Acta, Volume 50, Issue 20, 25 Jul. 2005, p 4182-4187, an method is discussed to coat $LiCoO_2$ particles with a layer of $AlPO_4$. The luminescent particle 102 with the first coating layer 104 may be coated with $AlPO_4$ nanoparticles in such a process or a similar process.

In an embodiment, when the second coating layer 106 comprises a Silicon based polymer, the Silicon based polymer is obtained from a material from a group of compounds having the basis structure of

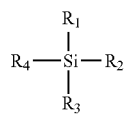

and wherein R1, R2 and R3 are hydrolysable alkoxy groups and R4 is selected from the group of C1-C6 linear alkyl groups, hydrolysable alkoxy groups and a phenyl group, or R1, R2 and R3 are individually selected from —$OCH_3$ and —$OC_2H_5$ and R4 is selected from —$CH_3$, —$C_2H_5$, —$OCH_3$, —$OC_2H_5$ and a phenyl group. In another embodiment, the Silicon based polymer is obtained from one of the following materials:

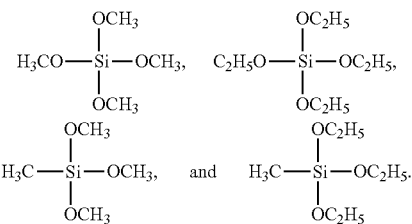

These materials are, respectively, named tetramethoxysilane, tetraethoxysilane, trimethoxy(methyl)silane, and triethoxy(methyl)silane.

The above discussed materials which form the basis of the Silicon based polymer of the second coating layer 106 are suitable for use in the sol-gel technology. The sol-gel process is a wet-chemical technique which is used to manufacture materials starting for a colloidal solution (sol) that acts as the precursor of an integrated network (gel) of network polymers.

In one specific optional embodiment, a Silicon based polymer layer, which is manufactured from tetraethoxysilane, is manufactured with the subsequent process: 100 g luminescent particles (with the first coating layer 104) powder is stirred in 1000 ml ethanol (EtOH) with 1 ml tetramethoxysilane for 10 min in a 2 l 3-neck flask. Then, 150 ml concentrated ammonia ($NH_3$) solution is added. The adding of ammonia results in the forming of water. After ammonia addition, 75 ml tetraethoxysilane in 500 ml EtOH is added trop-wise within 1 hour in the closed system while stirring. Every 15 min the suspension is sonicated for 10 sec. After a stirring time of 3 hours, the suspension is filtered and the luminescent particles (with the first and the second coating layer 104, 106) is washed with EtOH and dried at 200° C. for 24 hrs. The tetramethoxysilane (TMOS) acts as a primer, the amount added may be in the range from 0.5-10 ml. The amount of tetraethoxysilane (TEOS) added determines the thickness of the second coating layer 106 (which is also a function of the surface area of the luminescent particle 102 with the first coating layer 104). The range for TEOS can be in the range 10 ml to 150 ml (all related to 100 g of luminescent particles powder, 10 wt % EtOH suspension). The sonication process prevents the luminescent particles 102 with first coating layer 104 from agglomeration during the hydrolysis reaction. The stirring time is not critical in the sense that longer stirring times do not lead to inferior products. If the luminescent particle 102 powder with first coating layer 104 is sensitive towards hydrolysis it may be an option to first add a smaller amount of ammonia and later on the remaining amount. The total amount of ammonia may be in the range 50-350 ml (all related to 100 g 100 g of luminescent particles powder, 10 wt % EtOH suspension). It may be an option to increase the reaction speed by heating the suspension during the reaction. As a rule of thumb, 10 Kelvin temperature increase should lead to a doubling of the reaction speed. Another option may be to replace part of the ethanol by other alcohols like methanol or iso-propanol. The same holds for silane ester where part of the ethoxy groups may be replaced by methoxy or e.g.propoxy groups.

In a specific optional embodiment, the first coating layer 104 of $Al_2O_3$ is manufactured around the luminescent particles 102 by means of atomic layer deposition. In a plurality of cycles the first coating layer 104 is manufactured until the first coating layer has a required thickness. Initially the luminescent particles 102 are brought into a reactor. The temperature of the reactor is in the range from 50 to 250 degrees Celcius and the temperature of the luminescent particles is kept in the range from 150 to 300 degrees Celcius. A typical value for the reactor temperature is 95 degrees Celcius and a typical temperature at which the luminescent particles are kept is 200 degrees Celcius. The pressure within the reactor is in the range from $10^{-6}$ to $10^{-2}$ Pascal and has a typical value of $10^{-4}$ Pascal. One cycle of the atomic layer deposition comprises TMA (trimethylaluminum) in the reactor for 2 second, followed by 5 seconds of exhaustion, followed by 5 seconds of $H_2O$ in the reactor, followed by 10 seconds of exhaustion. The total number of required cycles depends on the required thickness of the first coating layer 102. The contact with water must be as short as possible and, thus, the period of time with $H_2O$ in the reactor may be shortened. Instead of $H_2O$, ozone may be used.

Figure 2:
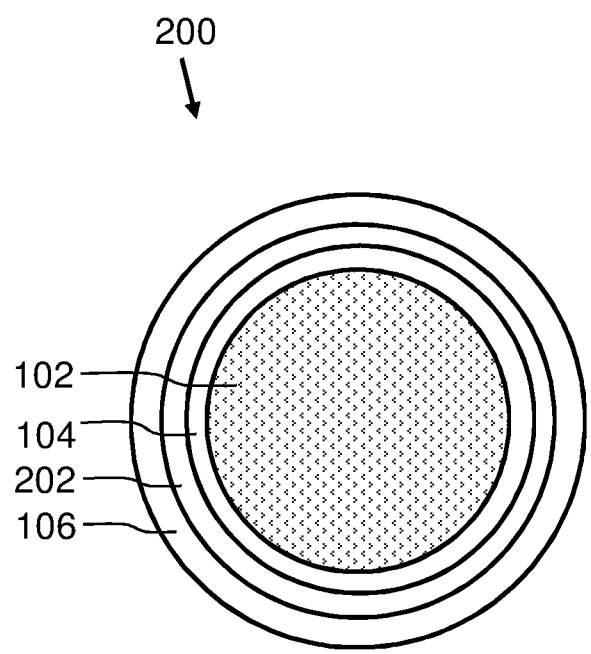

FIG. 2 schematically shows another embodiment of a coated luminescent particle 200. The coated luminescent particle comprises a luminescent particle 102, which has the same characteristics and embodiments as the luminescent particle 102 of FIG. 1, a first coating layer 104, which has the same characteristics and embodiments as the first coating layer 104 of FIG. 1, a third coating layer 202, and a second coating layer 106, which has the same characteristics and embodiments as the second coating layer 106 of FIG. 1. The third coating layer 202 is arranged in between the first coating layer 104 and the second coating layer 106. The third coating layer 202 may comprise a silicone based polymers, or may be a metal oxide layer, or may be continuous layer of one of the materials from the group of $AlPO_4$, $SiO_2$, $Al_2O_3$, and $LaPO_4$. Possible embodiments of such layers are already discussed in the context of FIG. 1.

Figure 3A:
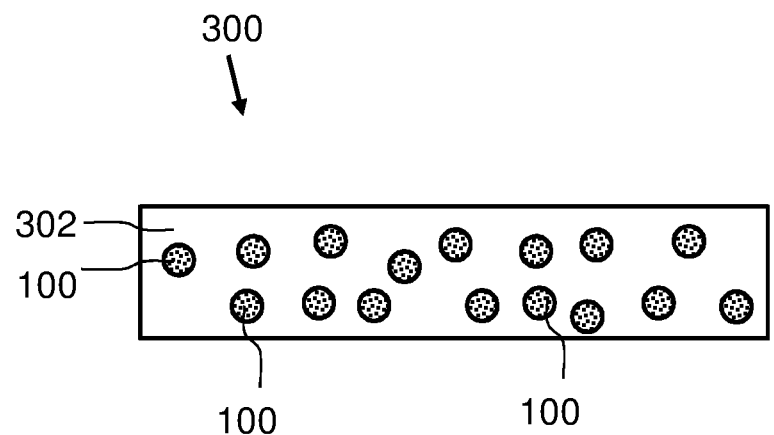

FIG. 3a schematically shows an embodiment of a luminescent element 300. A luminescent element comprises a binder material 302 and coated luminescent particles 100. The binder material is, for example, a matrix polymer such as, for example, polymethyl methacrylate (PMMA), Polyethylene terephthalate (PET), Polyethylene naphthalate (PEN) polycarbonate (PC), a silicone based materials, co-polymers, a glass based materials, or combinations thereof. The function of the binder is to keep the coated luminescent particles 100 together and to give a specific shape to the luminescent element 300. The luminescent element may also comprise other luminescent particles or luminescent materials. When other luminescent particles or luminescent materials are used, they may also be mixed in the binder material, or the luminescent element is subdivided in separate volumes which only comprise one specific luminescent material, in other words, the different luminescent materials are separated in space.

Figure 3B:
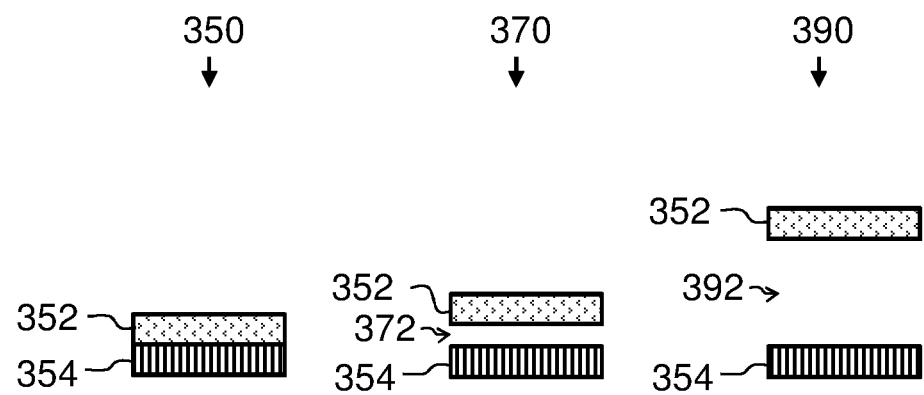

FIG. 3b schematically shows three embodiments of light sources 350, 370, 390. The light source 350, 370, 390 each comprise a light emitter 354, which is for example a Light Emitting Diode (LED), an Organic Light Emitting diode (OED) or a laser diode, and comprise a luminescent element 352 in accordance with embodiments of the luminescent element 300 of FIG. 3a. The light emitters emit, for example, blue light, and the coated luminescent particles of the luminescent element 352 absorb a portion of the blue light and convert a portion of the absorbed light into green light, or orange light, or red light. Another portion of the blue light may be transmitted through the luminescent element 352 and may be emitted together with the light emitted by the coated luminescent particles into the ambient of the light sources 350, 370, 390. In light source 350 the luminescent element 352 is directly applied on a light emitting surface of the light emitter 354. In light sources 370 and 390 there is a gap 372, 392 present between the light emitter 354 and the luminescent element 352. The gap is filled with a light transmitting material, such as a gas, a liquid or, for example, a transparent resin. In the light source 370, the luminescent element 352 is arranged in the vicinity of the light emitter 354 and the gap is only a few millimeters thick. In the light source 390, the luminescent element 352 is arranged remote configuration, which means that there is a relatively large distance between the light emitter 354 and the luminescent element 352. The gap 392 has, for example, at least a depth of 1 centimeter. The depth of the gap is measured along the shortest line between the light emitter 354 and the luminescent element 352.

Figure 4A:
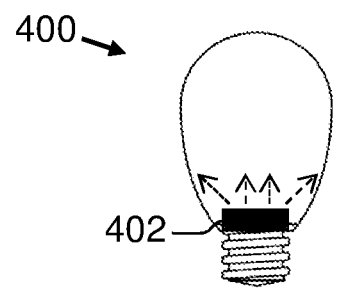

FIG. 4a schematically shows another embodiment of a light source 400. The light source 400 is a retrofit light bulb which comprises a light emitter with a luminescent element 402. The luminescent element 402 has characteristics and embodiments similar to the luminescent element 300 of FIG. 3a. In another embodiment, a retrofit light (discharge) tube (not shown) may be provided with light emitters and luminescent elements which comprise the coated luminescent particles according to the first aspect of the invention.

It is to be noted that the use of the coated luminescent particles is not limited to the use in light sources and/or luminaires. In specific examples, the coated luminescent particles may be used in display devices, in sensors, or in detectors.

Figure 4B:
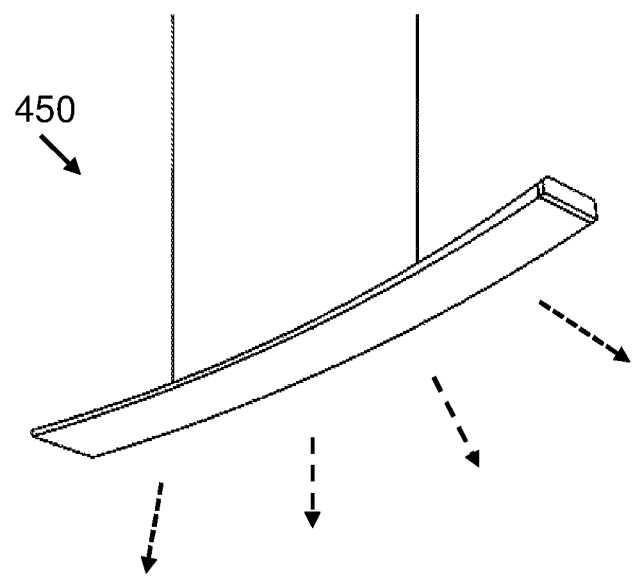

FIG. 4b schematically shows an embodiment of a luminaire 450 which comprises coated luminescent particles (not shown) according to the first aspect of the invention, a luminescent element (not shown) according to the second aspect of the invention, or a light source (not shown) according to the third aspect of the invention.

Figure 5:
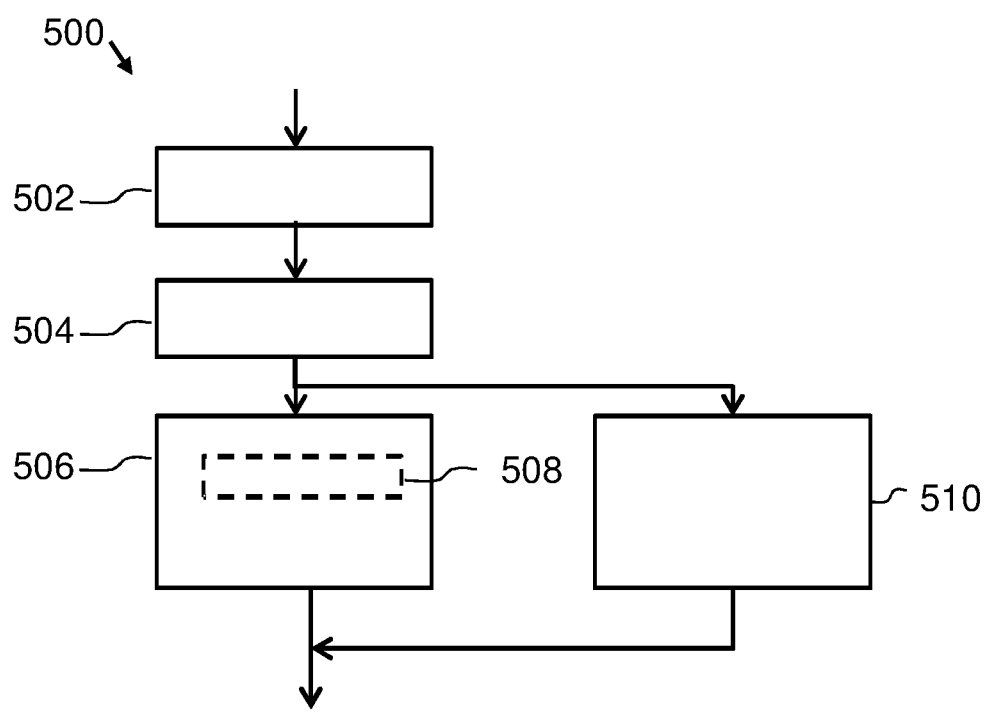

FIG. 5 schematically shows an embodiment of a method 500 of manufacturing coated luminescent particles. The method 500 comprises the steps of: i) providing 502 luminescent particles of a luminescent material, the luminescent particles being configured to absorb light in a first spectral range and to convert a portion of the absorbed light towards light of a second spectral range, the luminescent material is water sensitive, ii) depositing 504 a first coating layer of a metal oxide around the luminescent particles, and iii) manufacturing 506, 510 a second coating layer around the luminescent particles with the first coating layer. The manufacturing of the second coating layer may comprises manufacturing 506 the second coating layer on basis of a sol-gel technology or may alternatively comprise manufacturing 510 the second coating layer with a nanoparticle suspension technology. The basis for the sol-gel of the sol-gel technology is a material which comprises a central Silicon atom (a silicic acid ester). The nanoparticles suspension technology uses a suspension of $AlPO_4$, $SiO_2$, $Al_2O_3$, or $LaPO_4$ in a liquid.

In an embodiment of the method 500, the stage of manufacturing 506 the second coating on basis of the sol-gel technology may comprise the stage of obtaining a solution of a first material in water. The first material is one of a group of compounds formed by

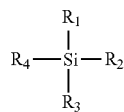

Wherein R1, R2 and R3 are hydrolysable alkoxy groups and R4 is selected from the group of C1-C6 linear alkyl groups, hydrolysable alkoxy groups and a phenyl group, or R1, R2 and R3 are individually selected from —OCH$_3$ and —OC$_2$H$_5$ and R4 is selected from —CH$_3$, —C$_2$H$_5$, —OCH$_3$, —OC$_2$H$_5$ and a phenyl group.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item or being distributed over several items. The mere fact that certain measures are recited in mutually different dependent claims does not indicate that a combination of these measures cannot be used to advantage.

The invention claimed is:

1. A coated luminescent particle, the coated luminescent particle comprising:
    a luminescent particle of a luminescent material, the luminescent material being configured to absorb light in a first spectral range and to convert a portion of the absorbed light towards light of a second spectral range,
    a first coating layer formed using layer deposition techniques forming a first barrier, first barrier being a water barrier, the first coating layer selected from the group of a metal oxide, a nitride, a phosphide and a sulfide-based coating, a thickness (th1) of the first coating layer is 5 nm≤th1≤30 nm, and
    a second coating layer formed using a sol-gel process forming a second barrier, second barrier being a water barrier, the second coating layer comprising a silicon-based polymer, a thickness (th2) of the second coating layer is 30 nm≤th2≤80 nm,
    the first coating layer and the second coating layer are light transmitting,
    the first coating layer encapsulates the luminescent particle and the second coating layer encapsulates the first coating layer.

2. The coated luminescent particle according to claim 1, wherein the luminescent material comprises sulfide and/or selenide, or a luminescent material of the groups of orthosilicates or thiogallates.

3. The coated luminescent particle according to claim 1, wherein the luminescent material comprises at least one of the materials calcium sulfide, strontium sulfide, calcium selenide sulfide.

4. The coated luminescent particle according to claim 1, wherein a diameter of the luminescent particle is smaller than 200 micrometer.

5. The coated luminescent particle according to claim 1, further comprising a third coating layer being interposed between the first coating layer and the second coating layer, the third coating layer is selected from the group consisting of a metal oxide layer and a layer of a silicon based polymer, wherein the third coating layer is light transmitting and forms a barrier for water.

6. The coated luminescent particle according to claim 1, wherein the silicon based polymer is obtained from a material from a group of compounds formed by

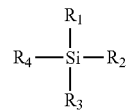

wherein R$_1$, R$_2$, and R$_3$ are hydrolysable alkoxy groups and R$_4$ is selected from the group consisting of C1-C6 linear alkyl groups, hydrolysable alkoxy groups and a phenyl group.

7. The coated luminescent particle according to claim 6, wherein the silicone-based polymer is obtained from a material from the group of tetramethoxysilane and tetraethoxysilane.

8. A luminescent converter element comprising:
    coated luminescent particles according to claim 1, and
    a binder for binding the coated luminescent particles in the luminescent converter element.

9. A light source comprising:
    a light emitter for emitting a light emission, the light emission comprising light in the first spectral range,
    a luminescent converter element according to claim 8, the luminescent converter element arranged to receive light being emitted by the light emitter.

10. The coated luminescent particle according to claim 1 further comprising a third coating layer being interposed between the first coating layer and the second coating layer, wherein the third coating layer is a continuous layer of a third material, the third material selected from the group consisting of AlPO$_4$, SiO$_2$, Al$_2$O$_3$, and LaPO$_4$, wherein the third coating layer is light transmitting and forms a water barrier.

11. The coated luminescent particle according to claim 1, wherein the silicon based polymer is obtained from a material from a group of compounds formed by

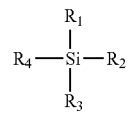

wherein R$_1$, R$_2$, and R$_3$ are individually selected from the group consisting of —OCH$_3$ and —OC$_2$H$_5$ and R4 is selected from the group consisting of —OCH$_3$ and —OC$_2$H$_5$.

12. A light source comprising:
    a light emitter for emitting a light emission, the light emission comprising light in the first spectral range,
    a plurality of coated luminescent particles according to claim 1, the coated luminescent particles being arranged to receive light being emitted by the light emitter.

13. A method of manufacturing coated luminescent particles, the method comprising:
    providing luminescent particles of a luminescent material, the luminescent particles being configured to absorb light in a first spectral range and to convert a portion of the absorbed light towards light of a second spectral range, depositing a first light transmitting coating layer using layer deposition techniques to form a first water barrier that encapsulates the luminescent particle, the first coating layer selected from the group of a metal oxide, a nitride, a phosphide and a sulfide-based coating, a thickness (th1) of the first coating layer is 5 nm≤th1≤30 nm, and depositing a second light transmitting coating layer using a sol-gel process to form a second water barrier that encapsulates the first coating layer, the second coating layer comprising a silicon-based polymer, a thickness (th2) of the second coating layer is 30 nm≤th2≤80 nm.

14. The method of manufacturing coating luminescent particles according to claim 13, wherein the stage of manufacturing the second coating layer comprises the stage of obtaining a solution of a first material in water, wherein the first material is one of a group of compounds formed by

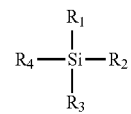

wherein R1, R2 and R3 are hydrolysable alkoxy groups and R4 is selected from the group consisting of C1-C6 linear alkyl groups, hydrolysable alkoxy groups and a phenyl group, or R1, R2 and R3 are individually selected from —OCH$_3$ and —OC$_2$H$_5$ and R4 is selected from —OCH$_3$ and —OC$_2$H$_5$.

* * * * *